United States Patent [19]

Kuesters et al.

[11] 4,147,604

[45] Apr. 3, 1979

[54] PHOTOPOLYMERIZABLE BINDERS CONTAINING DIAMINOBENZOPHENONES

[75] Inventors: Werner Kuesters; Guenter Heil; Martin Fischer; Manfred Eisert, all of Ludwigshafen; Hellmut Kast, Bobenheim-Roxheim, all of Fed. Rep. of Germany

[73] Assignee: BASF Aktiengesellschaft, Ludwigshafen, Fed. Rep. of Germany

[21] Appl. No.: 921,468

[22] Filed: Jul. 3, 1978

[30] Foreign Application Priority Data

Jul. 8, 1977 [DE] Fed. Rep. of Germany ....... 2730897

[51] Int. Cl.$^2$ ............................ C08F 2/46; C08F 8/18
[52] U.S. Cl. .................... 204/159.23; 96/115 P; 204/159.18; 204/159.19; 260/837 R; 260/859 R; 427/54
[58] Field of Search .................. 204/159.19, 159.18, 204/159.23; 96/115 P

[56] References Cited

U.S. PATENT DOCUMENTS

| | | | |
|---|---|---|---|
| 3,933,682 | 1/1976 | Bean | 252/431 |
| 3,945,833 | 3/1976 | Sumita et al. | 96/115 R |
| 3,966,573 | 6/1976 | Bean | 204/159.23 |
| 4,048,034 | 9/1977 | Martan | 204/159.23 |
| 4,056,453 | 11/1977 | Barzynski et al. | 204/159.23 |
| 4,067,791 | 1/1978 | Konno et al. | 204/159.15 |

FOREIGN PATENT DOCUMENTS 1486411 9/1977 United Kingdom.

*Primary Examiner*—Richard B. Turer
*Attorney, Agent, or Firm*—Keil & Witherspoon

[57] ABSTRACT

Photopolymerizable binders for printing inks, coatings and printing plates, based on olefinically unsaturated compounds, with or without a polymeric binder component, and containing a diaminobenzophenone compound as the photosensitizer, are improved in respect of their toxicity and shelf life if the diaminobenzophenone compound has the formula $R^1R^2N-C_6H_4-CO-C_6H_4-NR^3R^4$, where $R^1$ and $R^3$ are $H(OR^5)_x$ radicals, $R^5$ being alkylene of 2 or 3 carbon atoms and x being 1, 2 or 3, and $R^2$ and $R^4$ are each alkyl of 1 to 4 carbon atoms or are radicals of the type of $R^1$ and $R^3$.

3 Claims, No Drawings

PHOTOPOLYMERIZABLE BINDERS CONTAINING DIAMINOBENZOPHENONES

The present invention relates to a photopolymerizable binder for printing inks, coatings and printing plates, based on one or more photopolymerizable olefinically unsaturated compounds, with or without a polymeric binder component, which binder contains an advantageous diaminobenzophenone compound as the photosensitizer.

Benzophenone derivatives containing amino groups are known. 4,4'-Bis-(N-dimethylamino)-benzophenone (Michler's ketone) and its use in photoinitiator systems or as a photosensitizer for photopolymerizable systems have been described particularly frequently (cf. German Laid-Open Application DOS 1,522,359). Disadvantages of Michler's ketone are its toxicity, which is too high for certain applications, its limited solubility in numerous organic solvents and its limited compatibility with some polar photopolymerizable binders, as a result of which, if a fairly high concentration of photosensitizer is required, haze may readily occur in the corresponding mixture, which interferes with the photopolymerization.

It is an object of the present invention to provide, for use in photopolymerizable binders, a replacement for Michler's ketone, which is less toxic, exhibits improved compatibility with photopolymerizable mixtures and can be used in a more versatile way as a photosensitizer, i.e. as a component in a photoinitiating system for a photopolymerizable composition.

We have found that a photopolymerizable binder for printing inks, coatings and printing plates which is based on one or more photopolymerizable olefinically unsaturated compounds, with or without a polymeric binder component, and which contains a diaminobenzophenone compound as the photosensitizer exhibits the desired improved properties if it contains a diaminobenzophenone compound of the formula (I)

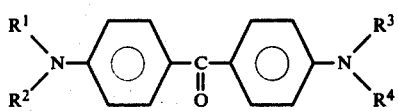

where $R^1$ and $R^3$ are $H(OR^5)_x$ radicals, $R^5$ being alkylene of 2 or 3 carbon atoms and x being 1, 2 or 3, and $R^2$ and $R^4$ are each alkyl of 1 to 4 carbon atoms or are radicals of the type of $R^1$ and $R^3$.

Examples of such compounds are 4,4'-bis-(N-β-hydroxyethyl-N-methylamino)-benzophenone, 4,4'-bis-(N-β-hydroxyethyl-N-ethyl-amino)-benzophenone, 4,4'-bis-(N-β-hydroxyethyl-N-propyl-amino)-benzophenone, 4,4'-bis-(N-β-hydroxypropyl-N-methyl-amino)-benzophenone, 4,4'-bis-(N-hydroxypropyl-N-methyl-amino)-benzophenone, 4,4'-bis-(N-hydroxyethoxyethyl-N-methyl-amino)-benzophenone of the formula (II)

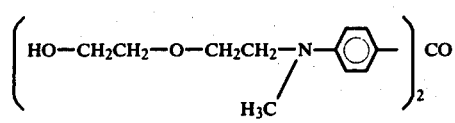

and 4,4'-bis-(N,N-dihydroxyalkyl-amino)-benzophenones, eg. 4,4'-bis-(N,N-di-β-hydroxyethyl-amino)-benzophenone and 4,4'-bis-(N,N-di-β-hydroxypropyl-amino)-benzophenone, and unsymmetrically substituted benzophenones, eg. 4-(N,N-di-β-hydroxyethylamino)-4'-(N,N-di-β-hydroxypropylamino)-benzophenone of the formula (III)

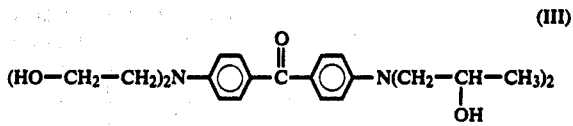

The 4,4'-bis-(N-hydroxyethyl-N-alkylamino)-benzophenones, where alkyl is of 1 to 4 carbon atoms, are particularly suitable.

A technically simple method of preparation of the N-hydroxyalkylamino derivatives of benzophenone is the following reaction:

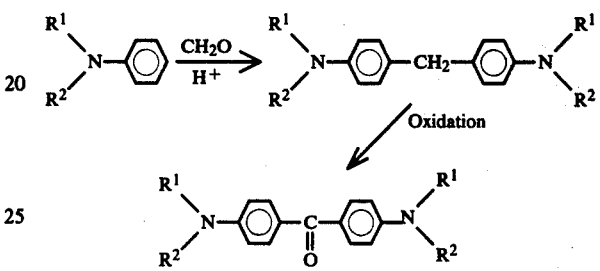

By using mixtures of different N-hydroxyalkyl-N-alkylanilines or N,N-dihydroxyalkylanilines for the reaction with formaldehyde or paraformaldehyde in the presence of acid, it is also possible to obtain unsymmetrical diaminobenzophenone derivatives, the intermediates formed always being the correspondingly substituted diaminodiphenylmethanes, which can then be converted to the correspondingly substituted diaminobenzophenones by oxidation with oxygen, eg. in the presence of chloranil and of an iron complex of dihydrodibenzotetraaza-annulene. The compounds used as photosensitizers in accordance with the invention can then easily be isolated in the form of usually acicular crystalline solids with melting points above 100° C., and be purified.

The diaminobenzophenone compounds used according to the invention in photopolymerizable binders have an activity comparable with that of Michler's ketone as photosensitizer, but have the advantage that they are less toxic than Michler's ketone, are more soluble in numerous organic solvents and exhibit improved compatibility with numerous polar photopolymerizable mixtures.

It is particularly advantageous if the binder according to the invention contains, in addition to the diaminobenzophenone compound, a conventional photoactivator, eg. benzoin, a benzoin ether, anthraquinone, benzil, benzil monoalkyl-ketals, fluorenone, fluorene, diacetyl and, in particular, benzophenone or a benzophenone derivative which has a low absorption in the range from 300 to 380 nm, eg. a derivative having an absorptivity ε of less than 200 at 360 nm, the molar ratios and amounts conventionally used for combination with Michler's ketone being applicable.

Suitable photopolymerizable olefinically unsaturated compounds are the conventional low molecular weight monomers and oligomers (especially with a molecular weight of less than 2,000), which are known per se for use in photopolymerizable binders for printing inks, coatings and printing plates, the type of monomer of course depending on the end use and on the polymeric binder which may be present and with which the monomer should be compatible. Preferred monomers are those with two or more olefinically unsaturated photopolymerizable double bonds, used by themselves or as a mixture with monomers having only one olefinically unsaturated photopolymerizable double bond, the proportion of the monomers with only one double bond being in general only from about 5 to 50 percent by weight, and preferably from 5 to 30 percent by weight, of the total amount of monomer.

Suitable olefinically unsaturated compounds are diacrylates, polyacrylates, methacrylates and polymethacrylates obtainable by esterification of diols or polyols with acrylic acid or methacrylic acid, eg. the diacrylates, triacrylates, dimethacrylates and trimethacrylates obtained from ethylene glycol, diethylene glycol, triethylene glycol, polyethylene glycol having a molecular weight of up to about 500, 1,2-propanediol, 1,3-propanediol, neopentylglycol (2,2-dimethyl-propanediol), 1,4-butanediol, 1,1,1-trimethylolpropane, glycerol or pentaerythritol, as well as the monoacrylates and monomethacrylates of such diols and polyols, eg. ethylene glycol monoacrylate, diethylene glycol monoacrylate, triethylene glycol monoacrylate and tetraethylene glycol monoacrylate, and monomers containing two or more olefinically unsaturated bonds as well as urethane groups and/or amide groups, eg. the low molecular weight compounds obtainable from aliphatic diols of the above type, organic diisocyanates and hydroxyalkylacrylates or methacrylates. Further examples of suitable olefinically unsaturated compounds are acrylic acid, methacrylic acid, and their derivatives, eg. acrylamide, methacrylamide, N-hydroxymethylacrylamide, N-hydroxymethylmethacrylamide and acrylates and methacrylates of monoalcohols of 1 to 6 carbon atoms.

Binders according to the invention which contain polar monomers and/or polar polymeric binders, eg. urethane-acrylates and epoxide-acrylates, have proved very suitable. Regarding suitable binder components and the use of the systems according to the invention, reference may be made to German Laid-Open Applications DOS 1,522,359, 2,200,478, 2,358,948 and 2,441,148; the diaminobenzophenone compounds used according to the invention may take the place of the Michler's ketone described in these publications.

Examples of suitable polymeric binder components are polyamides, polyurethanes, unsaturated polyesters and polyester-urethanes.

The photopolymerizable binders of the invention can be mixed in the conventional manner with conventional additives, eg. thermal polymerization inhibitors, dyes, plasticizers and the like.

The greater solubility of the photosensitizers used according to the invention is of particular importance when the sensitizers are used to achieve adequate curing of highly pigmented photopolymerizable systems, especially where pigments having a high absorption are used, for example UV-curing printing inks containing a black of high hiding power. Examples 5 and 6 show that the prints obtained with the new photosensitizers exhibit greatly improved brilliance. The binders according to the invention are particularly suitable for use in UV-curing printing inks applied in a thickness of less than 10 μm, but are also suitable for photopolymer printing plates, e.g. offset printing plates, and for photoresist materials.

In the Examples and Comparative Experiments which follow, parts and percentages are by weight, unless stated otherwise.

EXAMPLE 1

A mixture of 151 parts of N-methyl-N-hydroxyethylaniline, 16.5 parts of paraformaldehyde and 100 parts of glacial acetic acid is heated for 1.5 hours at 60°–70° C. After adding 230 parts of methanol, 25 parts of chloranil and 2.5 parts of the iron complex of dihydrodibenzotetraaza-annulene to the condensation solution, the latter is treated with air at 50°–52° C. and 1–3 bars. The oxidation is discontinued when virtually no further oxygen is taken up. The reaction mixture is cooled to 10° C., whereupon colorless needles crystallize out, which are filtered off and washed with 190 parts of methanol. After recrystallization from methanol, 885 parts of 4,4'-bis-(N-methyl-N-hydroxyethylamino)-benzophenone of melting point 153° C. are obtained.

EXAMPLE 2

A UV-curable binder consisting of 20% of a urethane-acrylate (prepared by reacting an aliphatic biuret isocyanate with a stoichiometric amount of hydroxypropyl acrylate), 64% of another urethane-acrylate (prepared by reacting hexamethylene diisocyanate with a stoichiometric amount of hydroxypropyl acrylate), 10% of butanediol diglycidyl ether diacrylate, 3% of benzophenone and 3% of 4,4'-bis-(N-β-hydroxyethyl-N-methylamino)-benzophenone, is prepared by homogeneously mixing the components at 90°–100° C.

The UV-curable binder is clear even after 3 months' storage at room temperature.

COMPARATIVE EXPERIMENT A

A UV-curable binder is prepared exactly as described in Example 2, but instead of 3% of 4,4'-bis-(N-β-hydroxyethyl-N-methyl-amino)-benzophenone, 3% of 4,4'-bis-(N-dimethylamino)-benzophenone are used. The binder is stored for about 3 months at room temperature exactly like the binder of Example 2, but after this period shows distinct haze due to the presence of fine crystals.

EXAMPLE 3

A homogeneous mixture of 52% of an epoxy resin acrylate (prepared by reacting a bisphenol A/epichlorohydrin resin having an epoxide equivalent weight of 190 with 97 mol%, based on the epoxide groups, of pure acrylic acid), 40% of pentaerythritol tetraacrylate, 4% of benzophenone and 4% of 4,4'-bis-(N-β-hydroxyethyl-N-methylamino)-benzophenone is stored for 3 months at room temperature. The mixture remains clear and free from haze.

COMPARATIVE EXPERIMENT B

A homogeneous mixture is prepared exactly as described in Example 3, but instead of 4% of 4,4'-bis-(N-β-hydroxyethyl-N-methyl-amino)-benzophenone, 4% of 4,4'-bis-(N-dimethyl-amino)-benzophenone is used. The mixture is stored for 3 months at room temperature, exactly like the mixture of Example 3. At the end of this period, it is hazy due to the presence of fine crystals of 4,4'-bis-(N-dimethylamino)-benzophenone.

EXAMPLE 4 AND COMPARATIVE EXPERIMENT C

Two UV-curing binder mixtures comprising 30% of a urethane-acrylate (prepared by reacting an aliphatic biuret isocyanate with a stoichiometric amount of hydroxypropyl acrylate), 54% of a further urethane-acrylate (prepared by reacting hexamethylene diisocyanate with a stoichiometric amount of hydroxypropyl acrylate), 10% of N',N'-divinyl-2-oxo-hexahydropyrimidine, 3% of benzophenone and 3% of 4,4'-bis(N-β-hydroxyethyl-N-methylamino)-benzophenone (Example 4) or 3% of Michler's ketone (Comparative Experiment C) are applied separately in a thickness of about 1.3 μm to art paper, using a proofing press. The prints obtained with the different binder mixtures are irradiated on a commercial UV curing unit containing 2 medium-pressure mercury vapor lamps each having a power of 80 watts/cm of arc length, and the maximum conveyor belt speed at which an immediately tackfree and abrasion-resistant coating can be achieved by curing with only one lamp is determined.
Result:
maximum belt speed:
Example 4: 280 m/min
Comparative Experiment C: 280 m/min

EXAMPLE 5 AND COMPARATIVE EXPERIMENT D

Printing inks are prepared on a triple roll mill from 2 separate batches respectively comprising 18% of a blue pigment (C.I. Pigment Blue 15:3) and 82% of a mixture of the binder and the initiator system of Example 4 (this batch constituting Example 5), and 18% of the above blue pigment and 82% of a mixture of the binder and the initiator system of Comparative Experiment C (this batch constituting Comparative Experiment D). These inks are applied separately to art paper using a proofing press. The amount of ink applied is set so that the color prints have an optical density of 1.60–1.65 (measured by means of a commercial reflected light densitometer). The color prints are irradiated as described in Example 4 (one lamp being switched on), and the maximum conveyor belt speed is determined. The results are as follows:

| Batch | Maximum belt speed |
| --- | --- |
| Example 5 | |
| (a) Fresh printing ink | 160 m/min |
| (b) Printing ink stored for 2 weeks | 160 m/min |
| Comparative Experiment D | |
| (a) Fresh printing ink | 150 m/min |
| (b) Printing ink stored for 2 weeks | 130 m/min. |

After 2 weeks' storage, the printing ink from Comparative Experiment D exhibits a matter, grainy surface. Fine crystals of Michler's ketone are detectable under the microscope.

EXAMPLE 6 AND COMPARATIVE EXPERIMENT E

UV-curing printing inks are prepared from 2 separate batches respectively comprising 18% of carbon black and 82% of a mixture of the binder and the initiator system of Example 4 (this batch constituting Example 6), and 18% of carbon black and 82% of a mixture of the binder and the initiator system of Comparative Experiment C (this batch constituting Comparative Experiment E); color prints on art paper, having an optical density of 2.0–2.1, are prepared with these inks. The color prints are irradiated as described in Example 4 (but with both lamps switched on) and the maximum conveyor belt speed is determined. The results are:

| Batch | Maximum belt speed |
| --- | --- |
| Example 6 | |
| (a) Fresh printing ink | 125 m/min |
| (b) Printing ink stored for 2 weeks | 125 m/min |
| Comparative Experiment E | |
| (a) Fresh printing ink | 80 m/min |
| (b) Printing ink stored for 2 weeks | 70 m/min |

Here again, the sample of Comparative Experiment E showed a matter surface after 2 weeks' storage, due to the crystallization of Michler's ketone.

We claim:
1. A photopolymerizable binder for printing inks, coatings and printing plates, which consists essentially of at least one photopolymerizable olefinically unsaturated compound, with or without a polymeric binder component, and a diaminobenzophenone compound as the photosensitizer, wherein the diaminobenzophenone compound has the formula (I)

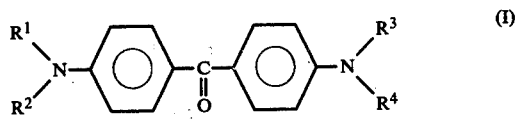

where $R^1$ and $R^3$ are $H(OR^5)_x$ radicals, $R^5$ being alkylene of 2 or 3 carbon atoms and x being 1, 2 or 3, and $R^2$ and $R^4$ are each alkyl of 1 to 4 carbon atoms or are radicals of the type of $R^1$ and $R^3$.

2. A photopolymerizable binder as claimed in claim 1, which contains, in addition to a diaminobenzophenone compound of the formula (I), benzophenone or a benzophenone derivative which has a low absorption in the range from 300 to 380 nm.

3. A photopolymerizable binder as claimed in claim 1, wherein the diaminobenzophenone compound of the formula (I) is 4,4'-bis-(N-hydroxyethyl-N-alkylamino)-benzophenone, where alkyl is of 1 to 4 carbon atoms.